(12) United States Patent
Tsai et al.

(10) Patent No.: US 6,847,061 B2
(45) Date of Patent: Jan. 25, 2005

(54) ELIMINATION OF IMPLANT DAMAGE DURING MANUFACTURE OF HBT

(75) Inventors: Chun-Lin Tsai, Hsin-Chu (TW); Denny D. Tang, Saratoga, CA (US); Chih-Min Chiang, Hsin-Chu (TW); Kuan-Lun Chang, Hsin Chu (TW); Tsyr Shyang, Hsin-Chu (TW); Ruey-Hsin Liu, Hsin-Chu (TW)

(73) Assignee: Taiwan Semiconductor Manufacturing Co., Hsinchu (TW)

( * ) Notice: Subject to any disclaimer, the term of this patent is extended or adjusted under 35 U.S.C. 154(b) by 18 days.

(21) Appl. No.: 10/406,120

(22) Filed: Apr. 3, 2003

(65) Prior Publication Data

US 2004/0195587 A1 Oct. 7, 2004

(51) Int. Cl.[7] ............................................. H01L 31/072
(52) U.S. Cl. ...................... 257/197; 257/183; 257/200; 438/235; 438/309; 438/312; 438/349; 438/375
(58) Field of Search ..................... 257/76–78, 183–201; 438/235, 309, 312

(56) References Cited

U.S. PATENT DOCUMENTS

| | | | |
|---|---|---|---|
| 5,846,867 A | 12/1998 | Gomi et al. | 438/318 |
| 5,897,359 A | 4/1999 | Cho et al. | 438/312 |
| 6,060,365 A | 5/2000 | Kim | 438/357 |
| 6,169,007 B1 | 1/2001 | Pinter | 438/320 |
| 6,506,659 B2 * | 1/2003 | Zampardi et al. | 438/375 |

* cited by examiner

*Primary Examiner*—David Nelms
*Assistant Examiner*—Andy Huynh

(57) ABSTRACT

During the conventional manufacture of HBTs, implant damage occurs which leads to enhanced internal base diffusion. This problem has been overcome by making the base and base contact area from a single, uniformly doped layer of silicon-germanium. Instead of an ion implant step to selectively reduce the resistance of this layer away from the base, a layer of polysilicon is selectively deposited (using selective epi deposition) onto only that part. Additionally, the performance of the polysilicon emitter is enhanced by means a brief thermal anneal that drives a small amount of opposite doping type silicon into the SiGe base layer.

15 Claims, 5 Drawing Sheets

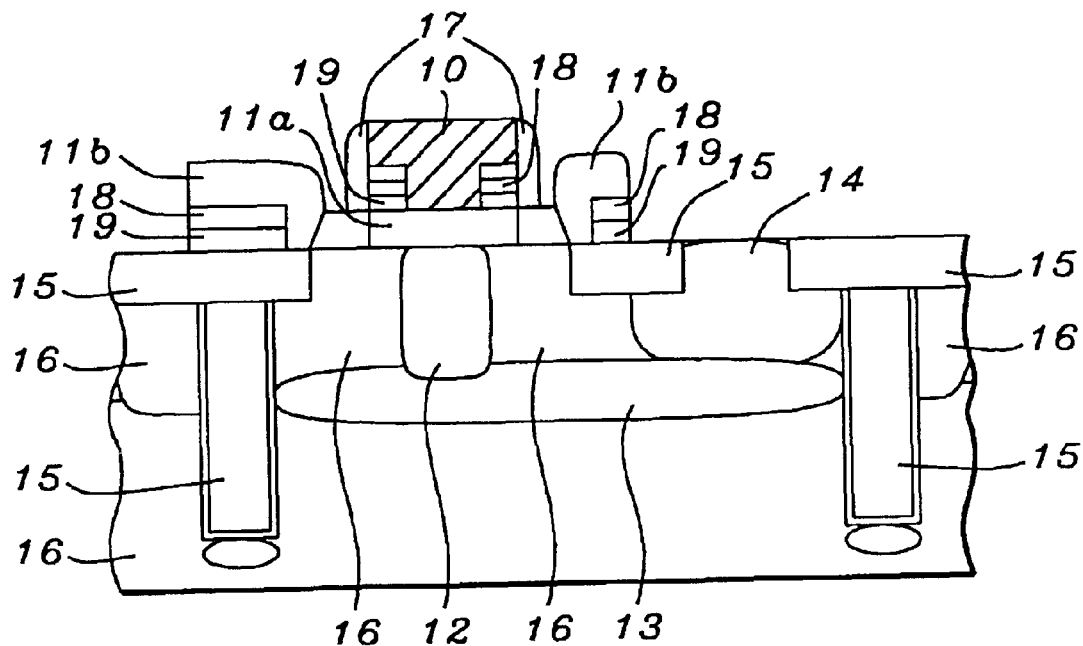
FIG. 1 – Prior Art
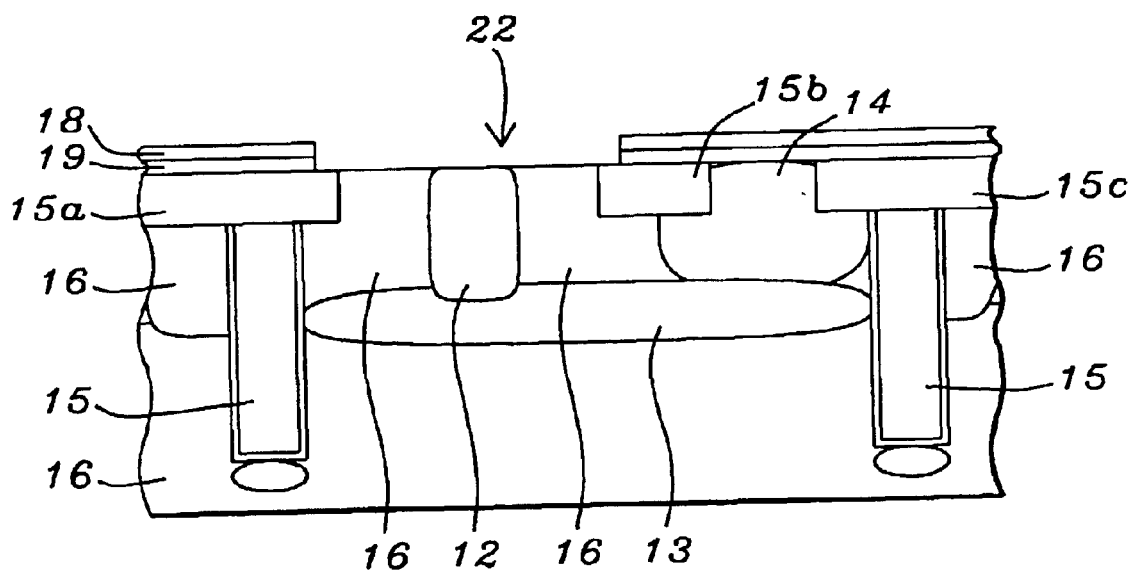
FIG. 2

ELIMINATION OF IMPLANT DAMAGE DURING MANUFACTURE OF HBT

FIELD OF THE INVENTION

The invention relates to the general field of heterojunction bipolar transistors (HBT) with particular reference to providing good base contact without introducing ion implant damage.

BACKGROUND OF THE INVENTION

FIG. 1 is a schematic cross-sectional view of a heterojunction bipolar transistor (HBT) of the prior art. N+ polysilicon emitter 10 sits atop base layer 11a of silicon-germanium. The actual area where it makes contact to the Si—Ge (i.e. the heterojunction) is restricted by the presence of insulating layers 18 and 19 of silicon nitride and silicon oxide respectively, the former having been used as a hard mask during manufacturing. The emitter pedestal is further protected by means of spacers 17 on its vertical sidewalls.

In order to be able to contact the base region, SiGe layer 11a has been laterally extended from both sides as layer 11b. The resistivity of 11a needs to be relatively high (to ensure efficient injection of electrons from the emitter) while the resistivity of 11b needs to be as low as possible in order to minimize the base resistance (which in turn controls the cutoff frequency of the device). During manufacturing, 11a and 11b are deposited as a single layer of relatively high resistivity. After formation of the emitter pedestal, the latter acts as a mask during implantation of acceptor ions (usually boron) into 11b whereby its resistivity is then substantially lowered.

Other features seen in FIG. 1 include N type silicon body 16 from whose upper surface N+ collector volume 12 extends downwards. Connection to collector 12 is made through N+ sinker 14 which is connected to 12 through buried N+ layer 13. Electrical isolation from other parts of the integrated circuit is achieved by means of dielectric-filled deep and shallow trenches 15.

There are several problems associated with the design seen in FIG. 1. In particular, when external base 11b is doped by ion implantation, implant damage occurs which leads to enhanced internal base diffusion. This, in turn, will enhance emitter junction diffusion, leading to an increase in emitter and base junction width which will degrade the speed of the device.

The present invention teaches how the device can be manufactured without the need to include the damaging ion implant step that is inherent to the prior art. This allows achievement of very shallow base and emitter junctions for the same thermal budget.

A routine search of the prior art was performed with the following references of interest being found:

In U.S. Pat. No. 6,169,007 B1, Pinter shows a HTB with an epi base. In U.S. Pat. No. 5,846,867, Gomi et al. disclose a method for a Si—Ge base in a HBT. Cho et al., in U.S. Pat. No. 5,897,359, show a method for a HBT while Kim shows a process for a transistor having an epi base in U.S. Pat. No. 6,060,365.

SUMMARY OF THE INVENTION

It has been an object of at least one embodiment of the present invention to provide a heterojunction bipolar transistor that is free of implant damage at the emitter-base interface (which leads to enhanced internal base diffusion).

Another object of at least one embodiment of the present invention has been that said transistor not be subject to enhanced emitter junction diffusion which degrades the speed of the device.

Still another object of at least one embodiment of the present invention has been to provide a process for manufacturing said transistor.

These objects have been achieved by making the base and base contact area from a single, uniformly doped layer of silicon-germanium. Instead of an ion implant step to selectively reduce the resistance of this layer away from the base, a layer of Second doping type polysilicon is selectively deposited (using selective epi deposition) onto only that part. Additionally, the performance of the polysilicon emitter is enhanced by means a brief thermal anneal that drives a small amount of N-type dopant into the SiGe base layer.

BRIEF DESCRIPTION OF THE DRAWINGS

FIG. 1 shows a HBT of the prior art.

FIG. 2 is the starting point for the process of the present invention.

DESCRIPTION OF THE PREFERRED EMBODIMENTS

Figure 3:
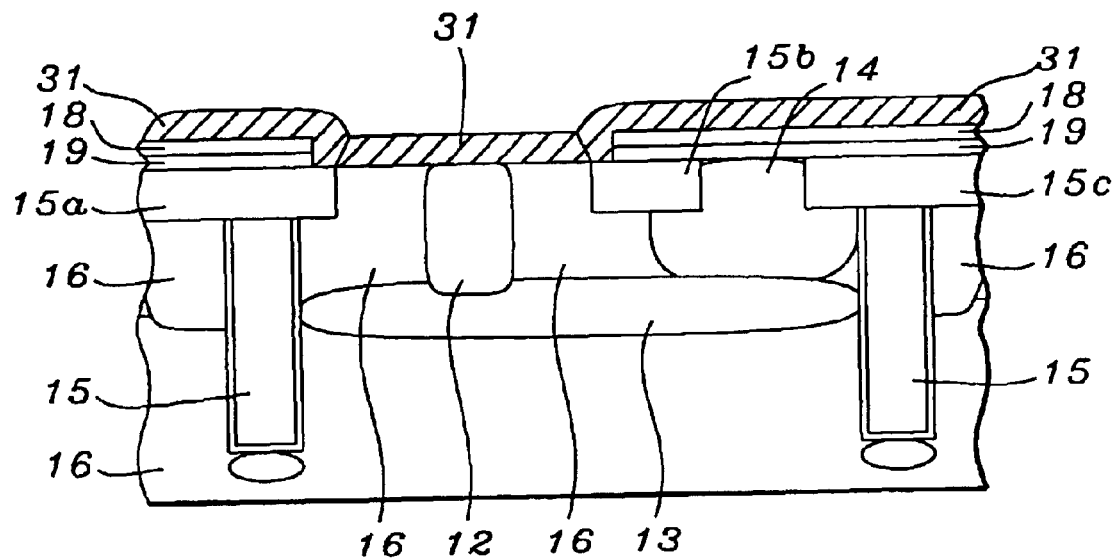
FIG. 3 is the structure after deposition of the SiGe layer.

We will describe the present invention through a detailed description of a process for its manufacture. This will also serve to explain the structure of the present invention. Referring now to FIG. 2, the process of the present invention begins with the provision of N-type silicon body 16 in which is present collector volume 12 that extends downwards from the top surface. Collector 12 is located between dielectric-filled shallow isolation trenches 15a and 15b. Collector contacting area 14 is located between trench 15b and a third shallow isolation trench 15c that is placed on the far side of 14.

The first step, as illustrated in FIG. 2, is the deposition of silicon oxide and nitride layers 19 and 18 respectively onto the surface of silicon body 16. These layers are then patterned to become a hard mask that defines opening 22, located so as to overlap shallow isolation trenches 15a and 15b while protecting trench 15c.

Next, as seen in FIG. 3, layer of silicon-germanium 31 is deposited onto the surface of 16 so that opening 22 is overfilled and silicon nitride layer 18 is covered. Layer 31 is uniformly doped (typically with boron) as part of its deposition process. Layer 31 contains between about 8 and 20 atomic % germanium, has a resistivity between about 3,000 and 4,000 ohm cm., and is deposited to a thickness between about 200 and 1,000 Angstroms.

Figure 4:
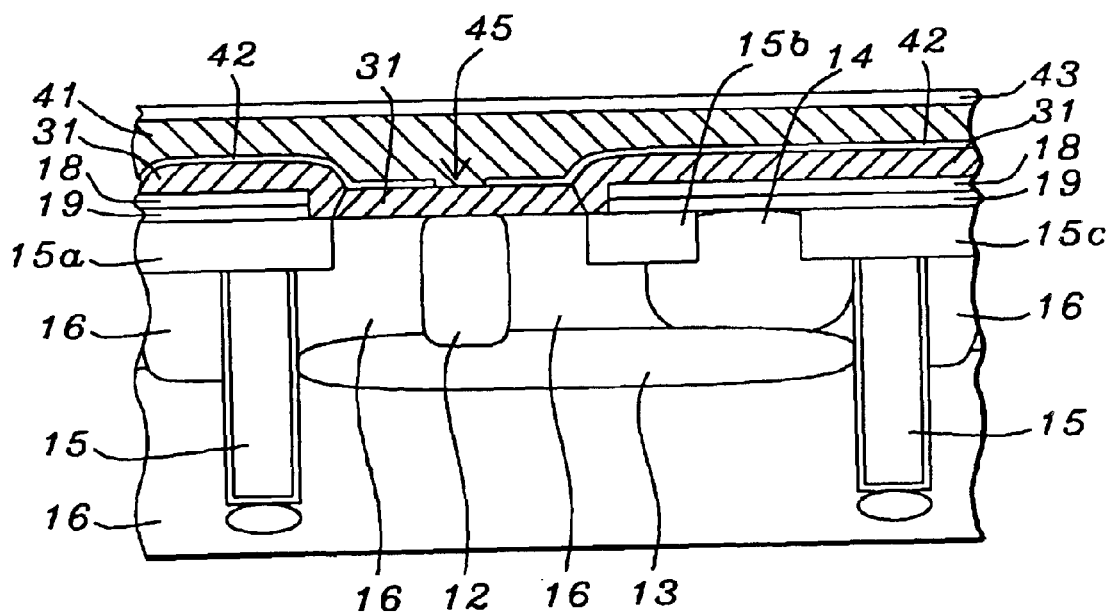
FIG. 4 is the above structure after deposition of a polysilicon layer.

Now, moving on to FIG. 4, layer 42 of silicon oxide is deposited onto silicon-germanium layer 31 and then patterned to form opening 45 that lies over and underlaps collector area 12. This is followed by the deposition of N-type polysilicon layer 41 which then fully covers all exposed surfaces, including filling of opening 45. Layer of polysilicon 41 is deposited to a thickness between about 1,500 and 3,000 Angstroms and has a resistivity between about 20 and 60 ohm cm. After layer 41 has been planarized, layer 43 of silicon oxide is deposited thereon.

Figure 5:
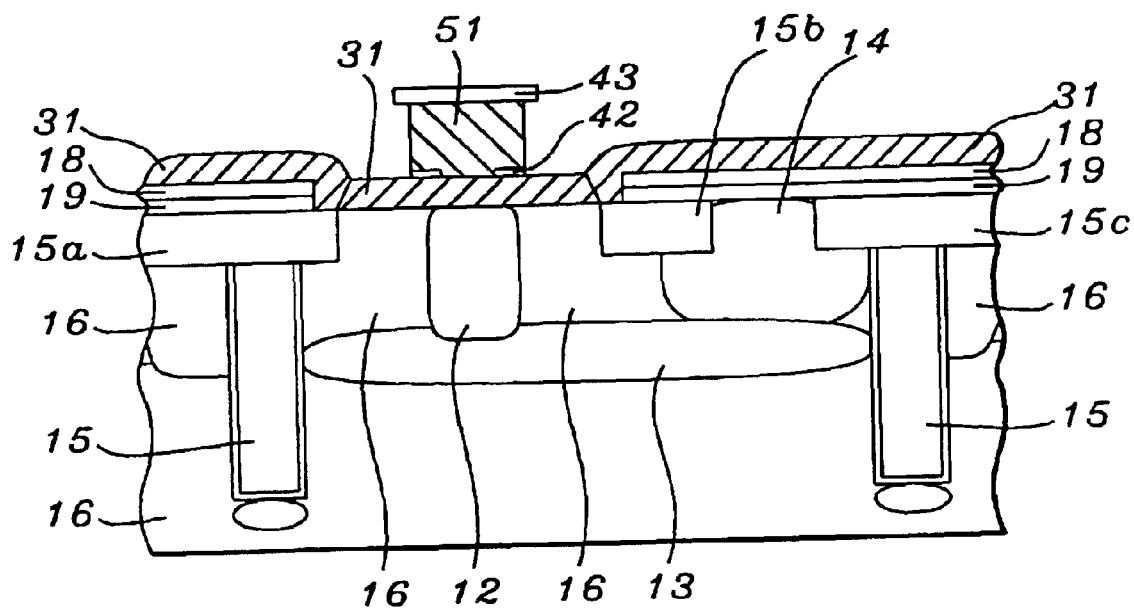
FIG. 5 shows said silicon layer after it has been patterned to form an emitter.
Figure 6:
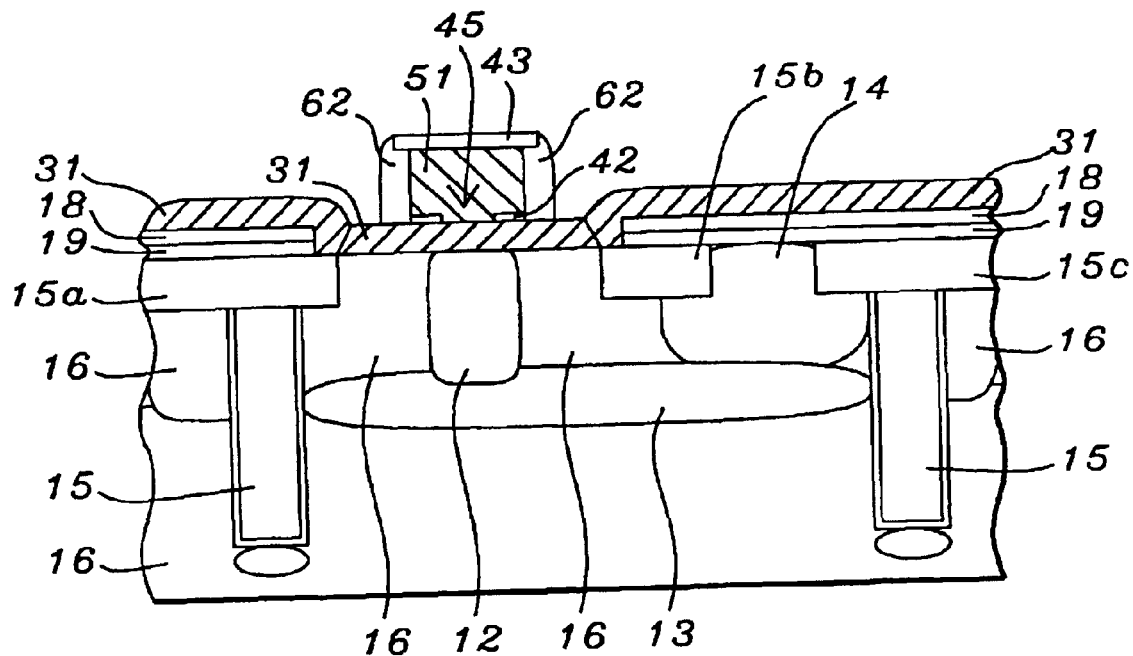
FIG. 6 shows said emitter after addition of insulating spacers on its sidewalls.

Referring next to FIG. 5, layer 45 of silicon oxide is now patterned and used as a hard mask for the formation of emitter pedestal 51. Then, as shown in FIG. 6, with the remains of layer 42 being left in place, insulating spacers 62 were formed on pedestal 51's sidewalls, resulting in the complete encapsulation of the emitter in insulation, except for opening 45.

Figure 7:
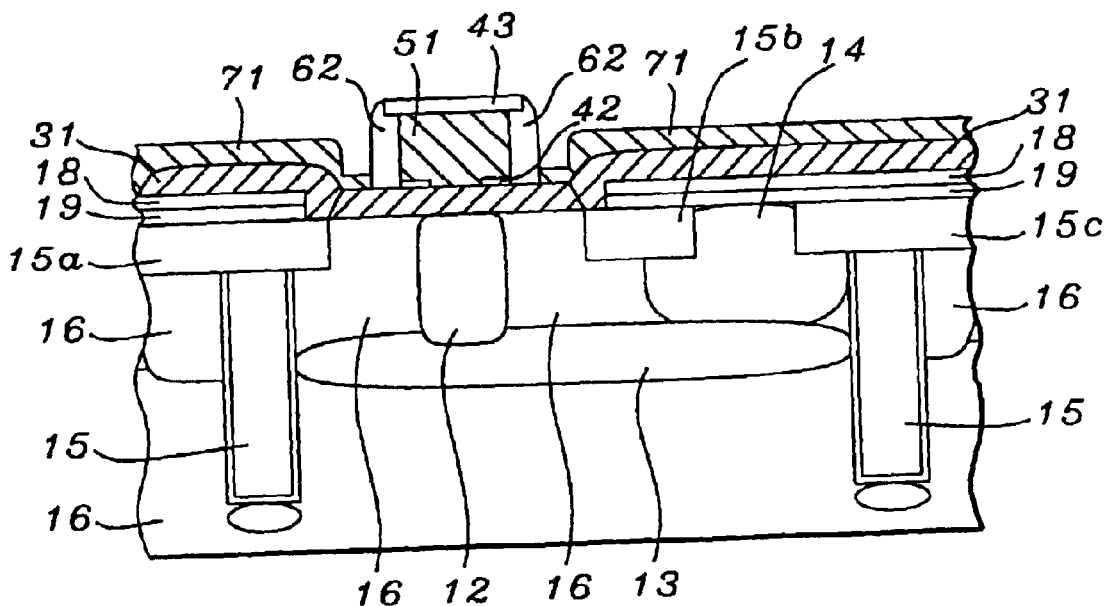
FIG. 7 illustrates selective epitaxial deposition of doped P-silicon onto SiGe.

Referring now to FIG. 7, in a key step, layer of doped P-silicon 71 is deposited onto silicon-germanium layer 31, and only onto layer 31. This was accomplished by using selective epitaxial deposition, using low pressure chemical vapor deposition (LPCVD) with a $Si_2H_6$ gas source. Layer of doped P-silicon 71 was deposited to a thickness between about 2,000 and 2,500 Angstroms and has a sheet resistance between about 10 and 40 ohms per square.

Figure 8:
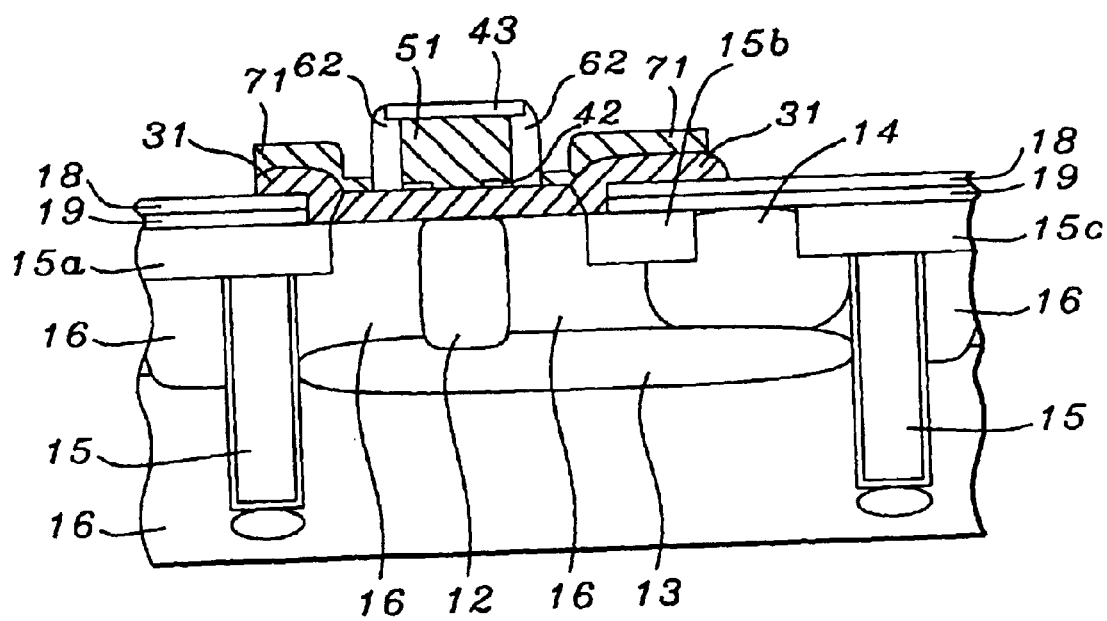
FIG. 8 shows the base contact area after patterning.
Figure 9:
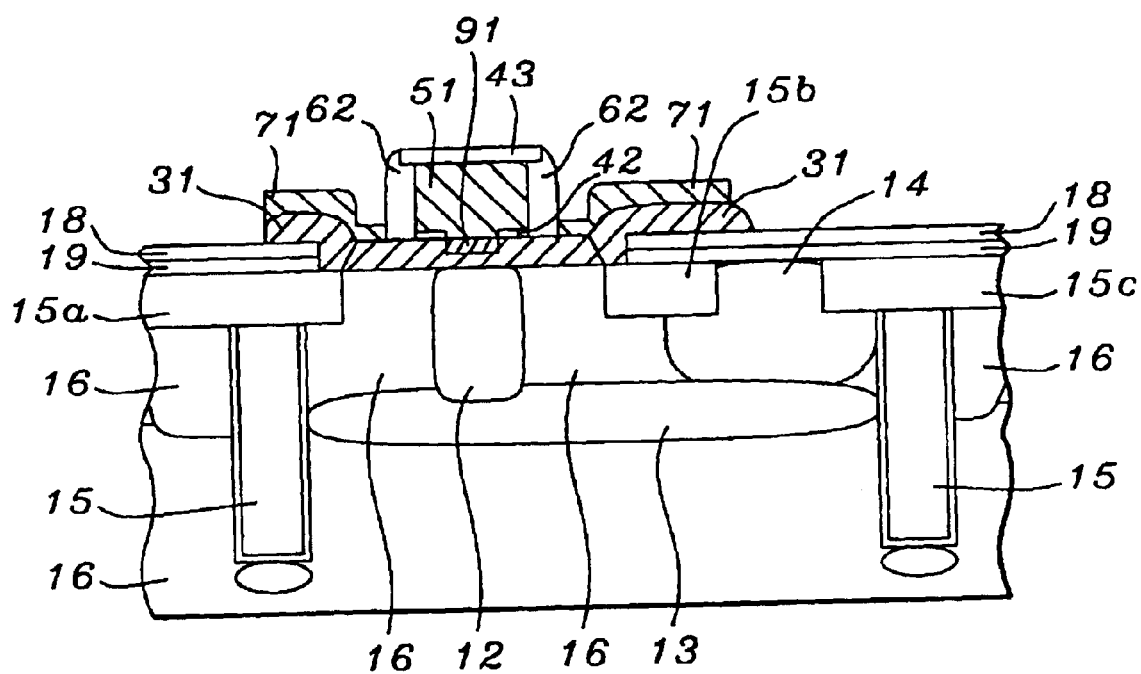
FIG. 9 illustrates how base width is reduced by means of a brief heat treatment.

Then, as shown in FIG. 8, layers 31 and 71 were patterned to form the base contact area. Finally, in another key step, the structure is subjected to a rapid thermal anneal— typically, heating to a temperature between about 1,000 and 1,100° C. for between about 10 and 20 seconds. This causes N-dopant material from polysilicon emitter 51 to diffuse into silicon-germanium layer 31, thereby forming region 91, as shown in FIG. 9. Region 91 is an extension of the emitter and it serves to control the base width as well as to ensure that, at the interference to the base, the emitter comprises single crystal material. Region 91 is typically between about 150 and 200 Angstroms thick.

What is claimed is:

1. A base contact for a heterojunction bipolar transistor, comprising:

a first doping type silicon body having a surface that includes a collector area;

a layer of uniformly doped silicon-germanium, on said surface, that overlaps and contacts said collector area, thereby defining said base contact;

over said silicon-germanium layer, a polysilicon emitter pedestal that overlaps said collector area and that touches said base contact in an area that underlaps said collector area;

a layer of opposite type doped silicon on, and only on, said layer of silicon-germanium wherever said silicon germanium is not covered by said emitter pedestal; and an amount of first dopant type material that has diffused from said polysilicon emitter into said silicon-germanium layer for a distance.

2. The base contact described in claim 1 wherein said layer of silicon-germanium contains between about 8 and 20 atomic % germanium.

3. The base contact described in claim 1 wherein said layer of silicon-germanium has a resistivity between about 3,000 and 4,000 ohm cm.

4. The base contact described in claim 1 wherein said layer of silicon-germanium has a thickness between about 200 and 1,000 Angstroms.

5. The base contact described in claim 1 wherein said layer of opposite type doped silicon has a thickness between about 1,500 and 3,000 Angstroms.

6. The base contact described in claim 1 wherein said layer of opposite type doped silicon has a sheet resistance between about 20 and 60 ohms per square.

7. The base contact described in claim 1 wherein said distance that first dopant type material has diffused from said polysilicon emitter into said silicon-germanium layer is between about 150 and 200 Angstroms.

8. A heterojunction bipolar transistor, comprising:

a first doping type silicon body having a first surface that includes an active collector area between first and second shallow dielectric isolation trenches and a collector contacting area between a third shallow dielectric isolation trench and said second trench;

a layer of uniformly doped silicon-germanium on said first surface within a first opening and on a first layer of silicon nitride, said layer of silicon-germanium having the form a base contact area;

on said silicon-germanium layer, a polysilicon emitter pedestal that overlaps said active collector area and underlaps said base contact area, said emitter pedestal being encapsulated in a layer of insulation, except for a second opening in said insulation at its interface with said silicon-germanium layer where said polysilicon emitter directly contacts the silicon-germanium, said second opening underlapping said active collector area;

a layer of doped opposite type doped silicon on, and only on, said layer of silicon-germanium; and an amount of first dopant type material that has diffused from said polysilicon emitter into said silicon-germanium layer for a distance.

9. The transistor described in claim 8 wherein said layer of silicon-germanium contacts between about 8 and 20 atomic % germanium.

10. The transistor described in claim 8 wherein said layer of silicon-germanium has a resistivity between about 3,000 and 4,000 ohm cm.

11. The transistor described in claim 8 wherein said layer of silicon-germanium has a thickness between about 200 and 1,000 Angstroms.

12. The transistor described in claim 8 wherein said layer of opposite type doped silicon has a thickness between about 1,500 and 3,000 Angstroms.

13. The transistor described in claim 8 wherein said layer of opposite type doped silicon has a sheet resistance between about 20 and 60 ohms per square.

14. The transistor described in claim 8 wherein said distance that first dopant type material has diffused from said polysilicon emitter into said silicon-germanium layer is between about 150 and 200 Angstroms.

15. The transistor described in claim 8 wherein said polysilicon emitter has a resistivity between about 10 and 40 ohm cm.

* * * * *